United States Patent
Lutgen et al.

(10) Patent No.: US 10,211,296 B2
(45) Date of Patent: Feb. 19, 2019

(54) P-DOPING OF GROUP-III-NITRIDE BUFFER LAYER STRUCTURE ON A HETEROSUBSTRATE

(71) Applicant: AZURSPACE Solar Power GmbH, Heilbronn (DE)

(72) Inventors: Stephan Lutgen, Dresden (DE); Saad Murad, Erkrath (DE); Ashay Chitnis, Maharashtra (IN)

(73) Assignee: AzurSpace Solar Power GmbH, Heilbronn (DE)

( * ) Notice: Subject to any disclaimer, the term of this patent is extended or adjusted under 35 U.S.C. 154(b) by 0 days.

(21) Appl. No.: 16/026,630

(22) Filed: Jul. 3, 2018

(65) Prior Publication Data

US 2018/0331187 A1  Nov. 15, 2018

Related U.S. Application Data

(63) Continuation of application No. 15/700,289, filed on Sep. 11, 2017, now Pat. No. 10,026,814, which is a
(Continued)

(30) Foreign Application Priority Data

Feb. 15, 2013 (EP) .................................. 13155540

(51) Int. Cl.
*H01L 29/12* (2006.01)
*H01L 29/205* (2006.01)
(Continued)

(52) U.S. Cl.
CPC ........ *H01L 29/205* (2013.01); *H01L 21/0251* (2013.01); *H01L 21/0254* (2013.01);
(Continued)

(58) Field of Classification Search
CPC ........... H01L 29/2003; H01L 29/66462; H01L 29/7783; H01L 29/66431; H01L 29/205;
(Continued)

(56) References Cited

U.S. PATENT DOCUMENTS 7,884,393 B2   2/2011  Hashimoto et al.
2006/0281284 A1  12/2006  Harris et al.
(Continued)

FOREIGN PATENT DOCUMENTS

DE   102 56 911 A1   6/2004
EP   1 492 158 A2   12/2004
EP   2 434 532 A1   3/2012

OTHER PUBLICATIONS

Extended European Search Report for European Application No. 13155540.1 dated Aug. 1, 2013.

*Primary Examiner* — Hsien Ming Lee
(74) *Attorney, Agent, or Firm* — Muncy, Geissler, Olds & Lowe, P.C.

(57) ABSTRACT

An epitaxial group-III-nitride buffer-layer structure is provided on a heterosubstrate, wherein the buffer-layer structure has at least one stress-management layer sequence including an interlayer structure arranged between and adjacent to a first and a second group-III-nitride layers, wherein the interlayer structure comprises a group-III-nitride interlayer material having a larger band gap than the materials of the first and second group-III-nitride layers, and wherein a p-type-dopant-concentration profile drops, starting from at least $1 \times 10^{18}$ $cm^{-3}$, by at least a factor of two in transition from the interlayer structure to the first and second group-III-nitride layers.

13 Claims, 8 Drawing Sheets

Related U.S. Application Data continuation of application No. 15/341,590, filed on Nov. 2, 2016, now Pat. No. 9,786,744, which is a continuation of application No. 14/828,148, filed on Aug. 17, 2015, now Pat. No. 9,496,349, which is a continuation of application No. PCT/EP2014/052957, filed on Feb. 14, 2014.

(51) Int. Cl.
   *H01L 29/36*      (2006.01)
   *H01L 29/778*     (2006.01)
   *H01L 29/872*     (2006.01)
   *H01L 33/00*      (2010.01)
   *H01L 29/15*      (2006.01)
   *H01L 21/02*      (2006.01)
   *H01L 29/20*      (2006.01)
   *H01L 29/207*     (2006.01)
   *H01L 29/10*      (2006.01)

(52) U.S. Cl.
   CPC .. *H01L 21/02378* (2013.01); *H01L 21/02381* (2013.01); *H01L 21/02458* (2013.01); *H01L 21/02505* (2013.01); *H01L 21/02507* (2013.01); *H01L 21/02579* (2013.01); *H01L 29/1075* (2013.01); *H01L 29/151* (2013.01); *H01L 29/2003* (2013.01); *H01L 29/207* (2013.01); *H01L 29/36* (2013.01); *H01L 29/778* (2013.01); *H01L 29/7783* (2013.01); *H01L 29/872* (2013.01); *H01L 33/0025* (2013.01)

(58) Field of Classification Search
   CPC ..... H01L 29/36; H01L 29/151; H01L 29/778; H01L 29/872; H01L 33/007; H01L 33/0025
   USPC ....... 438/172, 191, 222, 226, 235, 590, 602, 438/604, 607; 257/11, 189, 192, 744, 257/745
   See application file for complete search history.

(56)   References Cited

U.S. PATENT DOCUMENTS

| | | |
|---|---|---|
| 2009/0236634 A1 | 9/2009 | Moriya et al. |
| 2010/0244041 A1 | 9/2010 | Oishi et al. |
| 2011/0062556 A1 | 3/2011 | Komiyama et al. |
| 2011/0298009 A1 | 12/2011 | Ikuta et al. |
| 2013/0062621 A1 | 3/2013 | Fichtenbaum et al. |

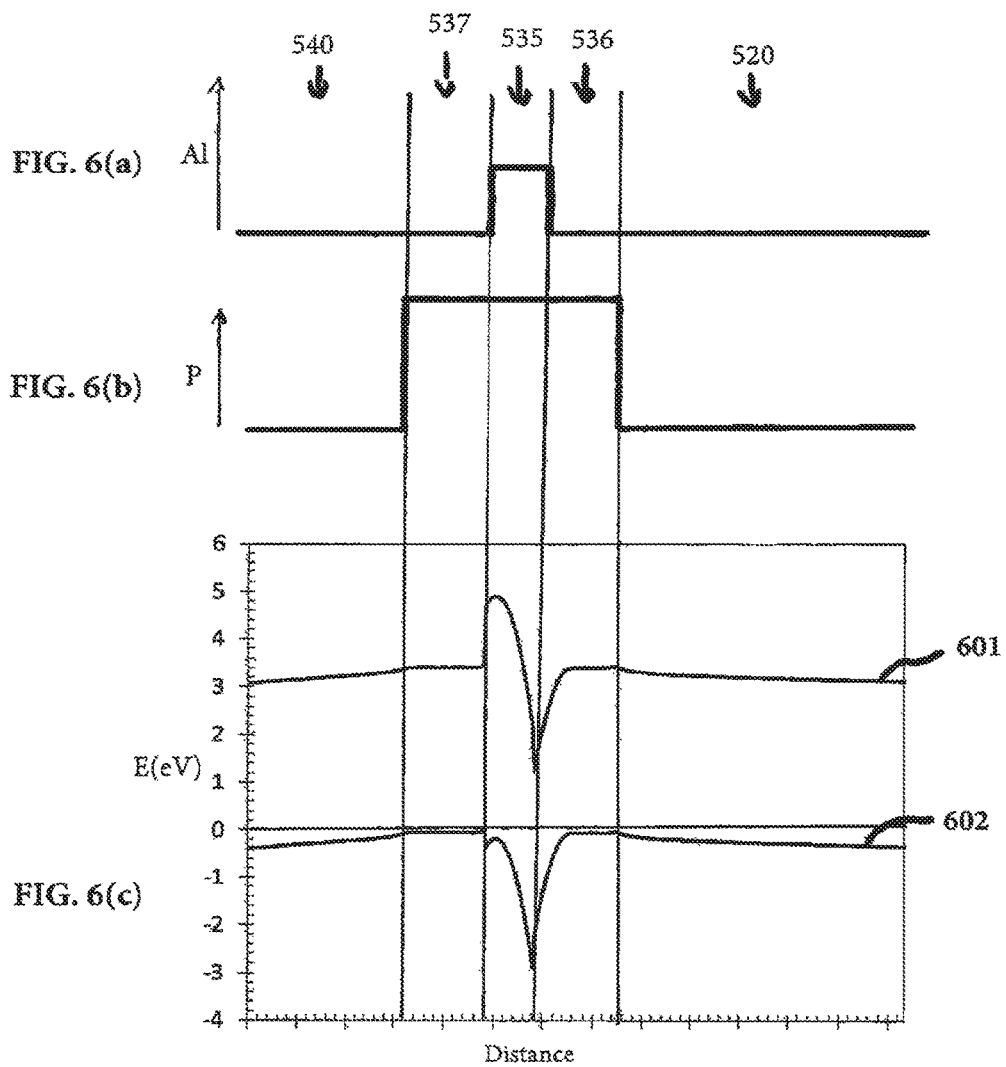

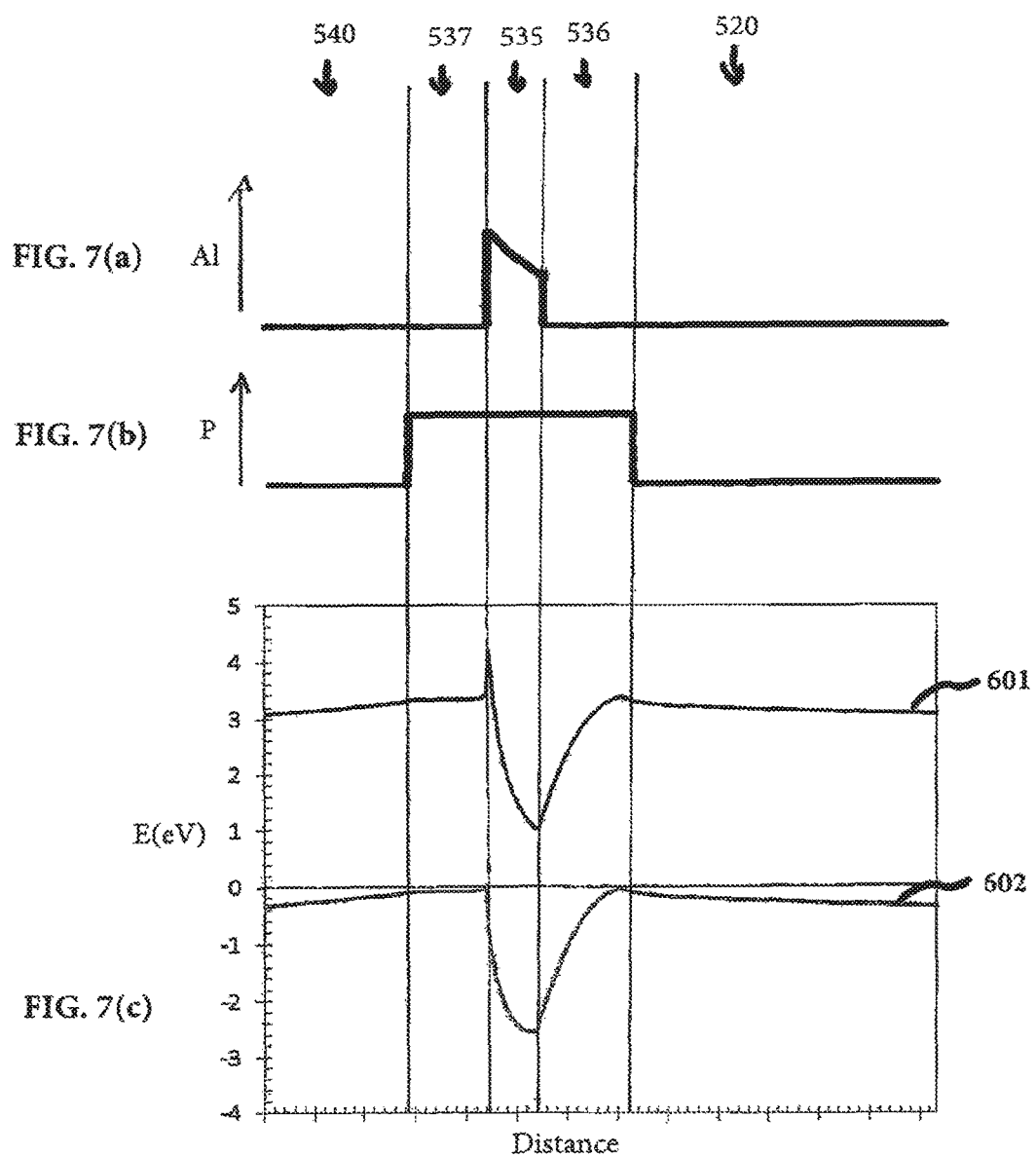

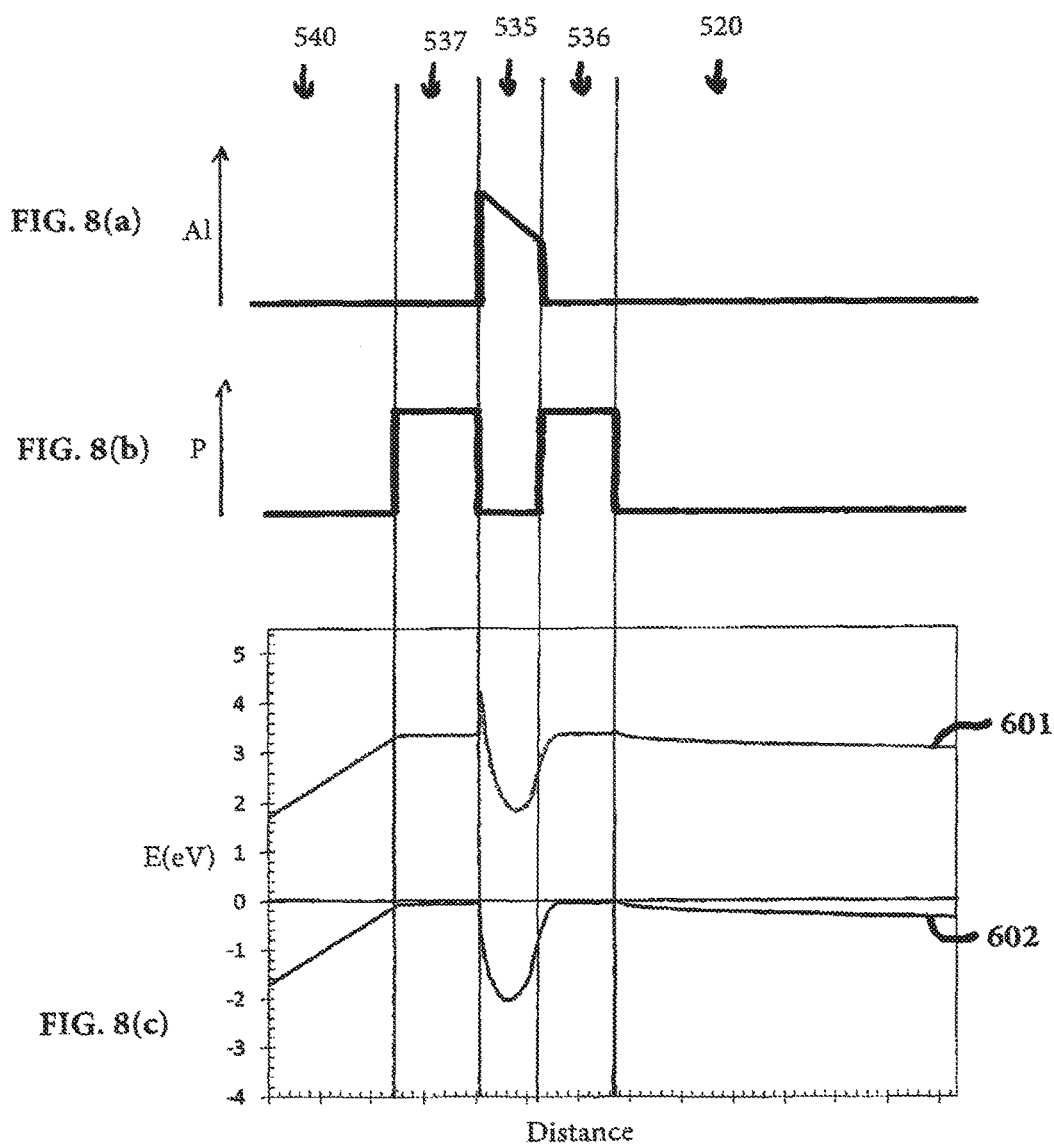

P-DOPING OF GROUP-III-NITRIDE BUFFER LAYER STRUCTURE ON A HETEROSUBSTRATE

This nonprovisional application is a continuation of U.S. Ser. No. 15/700,289, which was filed on Sep. 11, 2017, which was a continuation of U.S. application Ser. No. 15/341,590, which was filed on Nov. 2, 2016, which was a continuation of U.S. application Ser. No. 14/828,148, which was filed on Aug. 17, 2015, which was a continuation of International Application No. PCT/EP2014/052957, filed on Feb. 14, 2014, which claims priority to European Patent Application No. 13155540.1, filed on Feb. 15, 2013, all of which are herein incorporated by reference.

BACKGROUND OF THE INVENTION

Field of the Invention

The present invention relates to an epitaxial group-III-nitride buffer layer structure on a heterosubstrate. It also relates to a device structure, in particular to a layer structure of a transistor, a field-effect transistor (FET), a high-electron-mobility transistor (HEMT), in particular a normally-on or normally-off HEMT or a metal-insulator-semiconductor (MIS)HEMT, a Schottky diode, or a P-I-N structure.

Description of the Background Art

Most group-III-nitride based device structures, in particular transistor structures used nowadays for radio frequency (RF) or high-voltage (HV) power-conversion devices, are fabricated on a heterosubstrate, for example, on a substrate of a material other than a group-III-nitride material, such as a Si, SiC, or $Al_2O_3$ (Sapphire) substrate. The ability to use Si as a heterosubstrate is particularly advantageous because it allows using relatively cheap wafers having large industry-standard diameters, and because it forms the basis for monolithically integrating group-III-nitride devices into silicon-based integrated circuits made by a CMOS or related technology.

Such epitaxial group-III-nitride layer structures grown on a heterosubstrate, however, require a sophisticated buffer layer structure between the substrate and the active layer(s) in order to manage stress and defects within the crystalline structure.

In order to control the resistive properties of the buffer layer structure in a group-III-nitride layer structure, Fe doping has been widely used. However, the use of Fe has some disadvantages. More specifically, Fe doping results in an undesired tilt and twist of the crystallite structure, as can be revealed by x-ray diffractometry (XRD). Furthermore, the inventors found that Fe, when provided as a dopant during the growth of the epitaxial layer structure, segregates towards a channel layer, which in operation carries a two-dimensional electron gas, hereinafter also referred to in short as 2DEG. The presence of Fe in the channel layer is detrimental for achieving a desired high electron concentration in the 2DEG. Finally, Fe doping causes an undesired Fe contamination of the reactor used for deposition of the group-III-nitride layer structure. This causes an undesired Fe background doping, typically in concentrations up to about $10^{17}$ cm$^{-3}$ in nominally undoped upper HEMT-device layers and on the wafer surface. Since the presence of Fe induces traps for charge carriers, an unintentional Fe doping reduces a dynamical behavior of the on-resistance $R_{on}$ of group-III-nitride based HEMT devices. Due to the contamination risk, Fe doping is not considered compatible with wafer processing in CMOS processes. This forms an obstacle for an integration of the fabrication of group-III-nitride devices into existing, well-established CMOS process lines on silicon wafers.

The document U.S. Pat. No. 7,884,393 discloses the use of a homosubstrate in the form of a GaN substrate to achieve an extremely low dislocation density in an epitaxial group-III-nitride layer structure grown on the homosubstrate. The low dislocation density achievable by growth on a homosubstrate makes a carbon concentration in the different layers of the layer structure variable to some degree. By growing on a homosubstrate and controlling a carbon concentration, according to U.S. Pat. No. 7,884,393, the quality of a buffer layer and a channel layer of group-III-nitride field-effect transistors and HEMTs is improved. As an application, U.S. Pat. No. 7,884,393 describes a HEMT structure grown on a GaN substrate, which has single high-resistance buffer layer deposited immediately on the GaN substrate, a single GaN channel layer immediately on the buffer layer, and a single barrier layer immediately on the channel layer. The buffer layer is in different embodiments made of GaN or AlGaN and has a carbon concentration of $4 \times 10^{17}$ cm$^{-3}$ or higher. The highest carbon concentration disclosed for the buffer layer in U.S. Pat. No. 7,884,393 is $2 \times 10^{18}$ cm$^{-3}$. The adjacent channel layer does not form a part of the buffer layer, but forms an active layer of the HEMT. It is made of either GaN or InGAN and has a carbon concentration of not more than $4 \times 10^{16}$ cm$^{-3}$. A lower concentration of carbon in the channel layer is described in U.S. Pat. No. 7,884,393 as desirable for obtaining a high purity and thus a high electron mobility.

Group-III-nitride buffer layer structures grown on heterosubstrates, however, and in particular silicon, have a much higher dislocation density compared to those grown on a homosubstrate. This high dislocation density can currently not be avoided. Typical dislocation densities achieved in state-of-the-art buffer layer structures on heterosubstrates are in the range of $5 \times 10^7$-$5 \times 10^9$ cm$^{-2}$.

SUMMARY OF THE INVENTION

A first aspect of the invention disclosed in the present specification is an epitaxial group-III-nitride buffer layer structure on a heterosubstrate. The buffer layer structure comprises at least one stress-management layer sequence including an interlayer structure arranged between and adjacent to a first and a second group-III-nitride layer, wherein the interlayer structure comprises a group-III-nitride interlayer material having a larger band gap than the materials of the first and second group-III-nitride layers, and wherein a p-type dopant concentration profile drops, starting from at least $1 \times 10^{18}$ cm$^{-3}$, by at least a factor of two in transition from the interlayer structure to the first and second group-III-nitride layers.

The p-type dopant concentration profile matches the hole concentration profile if no compensation effects occur. If compensation effects have to be considered, the p-type dopant concentration is higher than the desired hole concentration. For instance, the p-type dopant concentration may be higher by a factor of 5, 10, 20, 50 or 100 than the hole concentration achieved. Thus, in different embodiments, the p-type dopant concentration profile considering compensation effects drops, starting for instance from at least $1 \times 10^{19}$ cm$^{-3}$ (factor 10), or from $1 \times 10^{20}$ cm$^{-3}$ (factor 100), by at least a factor of two in transition from the interlayer structure to the first and second group-III-nitride layers.

Suitable p-type dopants can be carbon and magnesium.

The buffer layer structure of the invention can be based on the recognition, that group-III nitrides grown on a heterosubstrate are subjected to substantial stress during the manufacturing process. In comparison with a deposition on a homosubstrate, this requires a special stress management in the buffer-layer structure. One stress management measure is including in the buffer layer structure a stress management layer sequence of an interlayer structure that is arranged between and adjacent to a first group-III-nitride layer and a second group-III-nitride layer, which have a smaller band gap than a group-III-nitride interlayer material. However, the provision of this stress management layer sequence implies the risk of a formation of undesired parasitic conductive channels in the buffer layer structure. The invention is based on the further recognition that an incorporation of carbon or magnesium as p-type dopant in the stress management layer sequence with a suitable concentration profile across the stress management layer sequence is effective in avoiding the formation of such parasitic conductive channels in the buffer layer structure. This way, it becomes even possible in some embodiments to avoid any intentional incorporation of iron atoms, which, as described, have been used in the prior art to achieve a highly resistive buffer layer structure.

The p-type concentration profile of the present invention can have a concentration contrast between the interlayer structure on one hand and the first and second group-III-nitride layers on the other hand. Namely, the p-type dopant concentration profile drops, starting from at least $1 \times 10^{18}$ cm$^{-3}$, by at least a factor of two in transition from the interlayer structure to the first and second group-III-nitride layers. Herein the drop in the p-type dopant concentration can either be sudden or continuous. The inventors have recognized in their experiments that a lower contrast or lower concentration values will not be efficient in avoiding parasitic conductive channels in the stress management layer sequence. The inventors are the first to manufacture a group-III-nitride based buffer layer structure with a stress management layer structure that achieves the mentioned high p-type concentration contrast between the interlayer structure and the first and second layers even at dislocation densities in the range of $5 \times 10^7$-$5 \times 10^9$ cm$^{-2}$, which are for instance observed when using a silicon substrate as the heterosubstrate. Thus, it is only the combination of the mentioned p-type dopant concentrations and their minimum difference as defined above, which can provide a highly-resistive buffer layer structure for group-III-nitrides on heterosubstrates without having to use transition metal atoms such as iron, which have negative side effects described earlier.

The high resistivity of the buffer layer structure enables a subsequent manufacture of highly efficient electronic group-III-nitride semiconductor devices based on the buffer stress management layer sequence, such as group-III-nitride-based high-electron mobility transistors or Schottky diodes. Consequently the buffer layer structure according to the first aspect of the invention allows providing a strain-managed buffer layer structure on a heterosubstrate, which due to its high resistivity is particularly suited as a base for highly efficient electronic devices requiring a high resistance of the buffer layer structure. With the buffer layer structures according to the invention high resistivities, which means high breakdown electric field strength of more than 1 MV/cm or even 2 or 3 MV/cm can be reached. By increasing an Al content in the interlayer structure the breakdown electric field strength can be additionally increased.

In the following, exemplary embodiments of the buffer layer structure of the first aspect of the invention will be described.

In an embodiment of the stress management layer sequence the interlayer structure has a p-type dopant concentration profile which drops in transition from the interlayer structure to the first and second group-III-nitride layer by at least one order of magnitude or even by at least two orders of magnitude. The building of a 2DEG in the buffer stress management layer sequence can be suppressed with higher effectivity the higher the drop in p-type dopant concentration is.

The p-type dopant concentration can be constant throughout the interlayer structure.

In an embodiment the first or the second, or the first and the second group-III-nitride layer are only unintentionally doped, for example, a measured p-type dopant concentration of not more than $1 \times 10^{17}$/cm$^3$. Higher ranges of p-type dopant concentration of the first or the second, or the first and the second group-III-nitride layer in the preferable range of $1 \times 10^{18}$/cm$^3$ or even $1 \times 10^{19}$/cm$^3$ can be tolerated with corresponding higher p-type dopant concentration in the interlayer structure.

In an embodiment of the invention the interlayer structure can be a single layer and the group-III-nitride interlayer material is of homogeneous composition, which has a larger band gap than the first and second group-III-nitride layers. The concentration of the p-type dopant in the interlayer structure is at least $6 \times 10^{18}$ cm$^{-3}$, a p-type dopant concentration of at least $1 \times 10^{20}$ cm$^{-3}$ can be preferred. P-type dopant concentrations of at least $6 \times 10^{18}$ cm$^{-3}$ in a single interlayer have the additional benefit of being able to compensate undesired parasitic oxygen concentrations in the layer. Thus, higher oxygen content in the layer is tolerable, which reduces the fabrication costs of the buffer-layer structure, because complex and expensive measures to reduce or avoid an unwanted oxygen incorporation into the layers during growth can be omitted. But even values of the p-type-dopant concentration of the single interlayer of up to $1 \times 10^{21}$ cm$^{-3}$ are beneficial in this regard.

In an embodiment the interlayer structure comprises a first group-III-nitride interlayer that is arranged between and adjacent to a second group-III-nitride interlayer and a third group-III-nitride interlayer. The first, second and third group-III-nitride interlayer have a respective homogeneous composition. A band gap of the first group-III-nitride interlayer is larger than band gaps of the second group-III-nitride interlayer and of the third group-III-nitride interlayer. The p-type dopant concentration throughout the interlayer structure is at least $5 \times 10^{18}$ cm$^{-3}$. Such an interlayer structure allows the use of a p-type-dopant concentration at a level between $5 \times 10^{18}$ cm$^{-3}$ and $1 \times 10^{19}$ cm$^{-3}$. The doping level that can be electrically activated is limited. Moderate p-type dopant concentrations in the interlayer structure which are able to eliminate the parasitic 2DEG channels are preferred because a higher p-type doping level can cause undesired process fluctuations. Nevertheless if process fluctuations can be compensated in another way, also higher p-type dopant concentrations are preferred.

In a variation of this embodiment the material of the first and second group-III-nitride layer is the same as the material of second and third group-III-nitride interlayers and the group-III-nitride interlayer material having a larger band gap than the materials of the first and second group-III-nitride layers is the material of the first group-III-nitride interlayer.

In an embodiment the interlayer structure comprises a first group-III-nitride interlayer that is arranged between and adjacent to a second group-III-nitride interlayer and a third group-III-nitride interlayer and the first group-III-nitride interlayer is compositionally graded. In this embodiment a p-type doping concentration of $1 \times 10^{18}$ cm$^{-3}$ throughout the interlayer structure is already sufficient to avoid the building of a parasitic 2DEG channel.

By using the described three-layer structure of the interlayer structure and especially a compositionally graded first group-III-nitride interlayer, p-type doping concentrations of $5 \times 10^{18}$ cm$^{-3}$, respectively $1 \times 10^{18}$ cm$^{-3}$ in the first group-III-nitride interlayer are sufficient to compensate undesired parasitic oxygen concentrations in the respective layer.

In an embodiment, the group-III-nitride interlayer material having a larger band gap additionally has a larger oxygen concentration than either the first or the second group-III-nitride layer, or than both the first and the second group-III-nitride layer.

The first group-III-nitride interlayer can be made of AlGaN having an Al mole fraction that increases with increasing distance from the substrate. Such an increase of the Al mole fraction with increasing distance improves the stress management of the buffer layer structure as well as it allows the use of lower p-type dopant concentrations in the interlayer structure.

A compositional grading of the second group-III-nitride interlayer or the third group-III-nitride interlayer or the second and the third group-III-nitride interlayer is part of another embodiment of the invention. The grading of these layers is especially advantageous in regard of avoiding additional stress due to lattice mismatches between the first group-III-nitride interlayer on one side and the first and second group-III-nitride layer on the other side.

In an embodiment of the invention the concentration of the p-type dopant can be higher in the second and third group-III-nitride interlayers than in the first group-III-nitride interlayer.

As p-type dopant carbon or magnesium, or a combination of carbon and magnesium are preferred.

In embodiments, there is no intentional Fe doping throughout the buffer layer structure. This is for instance expressed in an Fe concentration of less than $4 \times 10^{16}$ cm$^{-3}$. However, in some embodiments it may still be useful to also include iron in the buffer layer structure. Due to the presence of p-type dopant according to the present invention, iron can be incorporated in the buffer-layer structure in much lower concentrations, compared to prior-art buffer-layer structures.

In an embodiment of the invention the buffer layer structure can comprise at least two stress management layer sequences, wherein a second stress management layer sequence is arranged at a larger distance from the substrate than a first stress management layer sequence and has a second interlayer structure. With additional interlayer structures the stress management of the buffer layer structure on the heterosubstrate and the quality of subsequent active layers can be improved.

This can be further improved by the use of a second interlayer structure, which differs from the first interlayer structure in at least one of the following: a layer thickness of at least one of the interlayers of the interlayer structure, a p-type dopant concentration in at least one of the interlayers of the interlayer structure, a material composition of at least one of the interlayers of the interlayer structure, and a number of interlayers in the interlayer structure.

An embodiment comprises an additional group-III-nitride layer which is deposited on top of the buffer layer structure and wherein the additional layer has a graded p-type dopant concentration, wherein the p-type dopant concentration is higher in a first section of the additional layer adjacent to the buffer layer than in a second section of the additional layer further away from the buffer layer. Favorably the buffer layer structure is grown on a heterosubstrate such as a silicon, a silicon-on-insulator, a silicon carbide substrate, a Diamond or a $Ga_2O_3$-substrate.

In an embodiment, the stress management layer sequence can be configured to introduce a compressive stress in buffer layer structure during growth, which fully or at least partially compensates a tensile stress developing after growth during a cooling down of the buffer layer structure from growth temperature to room temperature.

The group-III-nitride interlayer material can have a larger band gap than the materials of the first and second group-III-nitride layers is a binary, ternary or quaternary first group-III-nitride material that has higher aluminum content than a second group-III-nitride material forming the first and second group-III-nitride layer. AlN, AlGaN, AlInGaN or AlInN are favorable materials forming the group-III-nitride interlayer material. In some embodiments, the layer made of the group-III-nitride interlayer material is a low-temperature layer, that is, it is grown at a lower temperature than the adjacent first and second group-III-nitride layers. Also the use of similar growth temperatures in the inter-layer structure and the first and second group-III-nitride layers can be useful in certain embodiments.

In order to further improve the stress management and the resistivity, an embodiment of the invention further comprises a buffer stack deposited between the heterosubstrate and the stress management layer sequence, the buffer stack comprising either a compositionally graded AlGaN buffer layer having a Ga fraction increasing with increasing distance from the heterosubstrate, or a superlattice formed by a stack of alternating group-III-nitride layers of two kinds, wherein the buffer stack has a p-type dopant concentration of at least $1 \times 10^{18}$ cm$^{-3}$.

In regard of a further improved stress management in combination with high resistivity in the whole buffer layer structure an embodiment of the invention is preferred, which comprises a nucleation layer between the buffer stack and the substrate, wherein the nucleation layer has a p-type dopant concentration of at least $1 \times 10^{18}$ cm$^{-3}$.

In an embodiment, the invention relates to a group-III-nitride device on a heterosubstrate, in particular a transistor, FET, a normally-on or a normally-off (MIS)HEMT, Schottky diode, PIN structure, comprising the epitaxial group-III-nitride buffer layer structures according to the first aspect of the invention or one of its embodiments. The buffer layer structures according to the invention are also advantageous for the use in optoelectronic devices such as LEDs or laser diodes. The device performance is substantially improved by including the buffer layer structure of the present invention.

The group-III-nitride device can comprise an only unintentionally doped channel active group-III-nitride layer, which means a p-type dopant concentration of not more than $1 \times 10^{17}$ cm$^{-3}$, preferably lower than $4 \times 10^{16}$ cm$^{-3}$. Such a low p-type dopant concentration in the active layer enables highly efficient performance of the group-III-nitride device, where high conductivity is required in the active group-III-nitride layer.

In another embodiment the group-III-nitride device can be a HEMT. Here, the active layer forms a channel layer. The HEMT further comprises a barrier layer on the active layer. A 2DEG can thus form at an interface between the channel layer and the barrier layer. Thin intermediate layers between the channel layer and the active layers may be used, as is known as such in the prior art. Preferably, the HEMT further comprises a cap layer on the barrier layer. The cap layer may comprise one or more p-type dopants. Carbon or magnesium may be used as the p-dopant or as one of the p-type dopants herein as well.

In a second aspect, the invention also relates to a method for fabricating a p-type-doped group-III-nitride buffer layer structure on a heterosubstrate, the method comprising fabricating an epitaxial group-III-nitride buffer layer structure on a heterosubstrate, wherein the buffer layer structure is fabricated as comprising a stress management layer sequence including an interlayer structure arranged between and adjacent to a first and a second group-III-nitride layer, wherein the interlayer structure comprises a group-III-nitride interlayer material having a larger band gap than the materials of the first and second group-III-nitride layers, and wherein the stress management layer sequence is fabricated to have a p-type dopant-concentration profile, which drops, starting from at least $1 \times 10^{18}$ cm$^{-3}$, by at least a factor of two in transition from the interlayer structure to the first and second group-III-nitride layers.

A metal-organic vapor epitaxy (MOVPE) or metal-organic chemical vapor deposition (MOCVD) can be used as a deposition method.

In an embodiment of the method the layer made of the group-III-nitride interlayer material having a larger band gap than the materials of the first and second group-III-nitride layers is deposited at a temperature lower than the temperature at which the first group-III-nitride layer and the second group-III-nitride layer are grown. With this temperature management, growth rate and V/III-ratio a high difference between the p-type dopant concentration in the group-III-nitride interlayer material and in the first or second group-III-nitride layer can be achieved. At the same time, this is advantageous for the stress-management function of the layer sequence.

In an embodiment of the method before the deposition of the stress management layer sequence a AlN nucleation layer is deposited on the substrate by a vapor phase deposition technique using a hydrogen-free carrier gas, preferably $N_2$, at a temperature between 800 and 1030° C., followed by a deposition of a buffer stack before depositing the stress management layer sequence by using Tetraethylgallium and Trimethylaluminum as precursors at a temperature between 800 and 1030° C., wherein the buffer stack comprises either a compositionally graded AlGaN buffer layer having a Ga fraction increasing with increasing distance from the heterosubstrate, or a superlattice formed by a stack of alternating group-III-nitride layers of two kinds. The low temperatures during the growth of the AlN nucleation layer and the buffer stack are advantageous for the incorporation of carbon concentrations of more than $1 \times 10^{17}$ cm$^{-3}$ and lead to a better crystal quality.

In order to control the p-type dopant concentration in the different layers of the buffer layer structure several growth parameters other than the growth temperature can be controlled and adjusted. Under otherwise constant growth conditions, increasing a flow rate of a nitrogen source used in the preparation of a layer leads to a decreased p-type dopant concentration in the layer. An opposite effect is achieved by a higher flow rate of a gallium precursor. A higher V/III ratio during the growth of a layer also leads to a lower p-type dopant concentration in the layer. A similar effect is achieved by a higher ambient pressure in the reactor and by a lowering the growth rate of a layer. An additional component to control and adjust the p-type dopant concentration is the use of special C-precursors like for example CBr4, CCl4.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 4b shows a current-voltage characteristic of the transistor of FIG. 4a;

FIGS. 6a to 6c show an aluminum content profile (a), a hole concentration profile (b) and band gap profiles at 0 V (c) of variation 1 of the structure of FIG. 5;

FIGS. 7a to 7c show an aluminum content profile (a), a hole concentration profile (b) and band gap profiles at 0 V (c) of variation 2 of the structure of FIG. 5; and FIGS. 8a to 8c show an aluminum content profile (a), a hole concentration profile (b) and band gap profiles at 300 V (c) of variation 3 of the structure of FIG. 5.

DETAILED DESCRIPTION

Figure 1:
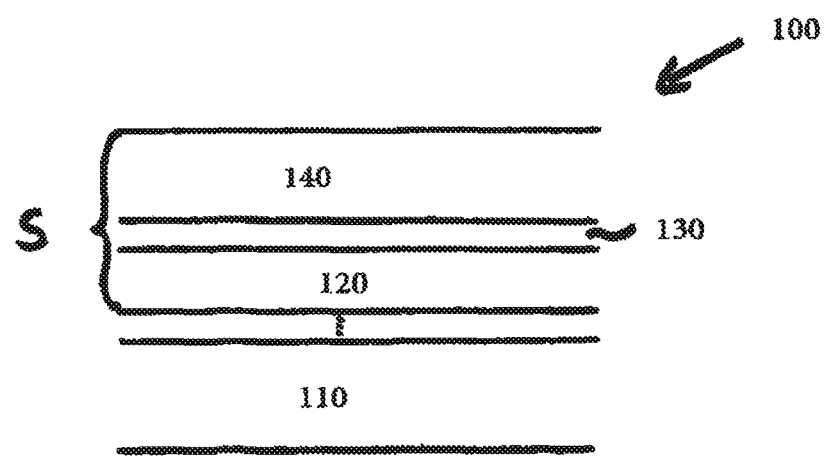
FIG. 1 shows an embodiment of a buffer layer structure according to the invention.

FIG. 1 shows an embodiment of a buffer layer structure 100 according to the invention. On a substrate 110, which in the present embodiment is made of silicon or silicon carbide, an intermediate layer may be grown. This intermediate layer is not shown in detail in FIG. 1, but only indicated by a space above the substrate 110. Such intermediate layer, which may contain a sub-layer structure, serves for achieving nucleation and initial lattice adaptation. In some embodiments, however, the intermediate layer may be omitted, and the buffer layer structure grown directly on the substrate. Examples of an intermediate layer in the form of a buffer stack will be described further below.

The buffer layer structure 100 comprises a stress management layer sequence S. The stress management layer sequence is formed of three group-III-nitride layers 120 to 140, of which a single interlayer 130 is sandwiched between a first group-III-nitride layer 120 and a second group-III-nitride layer 140.

In this stress management layer sequence S, the first group-III-nitride layer 120 is deposited first. It is made of GaN. In other embodiments, it is made of AlGaN. The thickness of the first group-III-nitride layer 120 is typically between 300 and 2000 nm, for instance 590 nm.

Directly on the first group-III-nitride layer 120, the single interlayer 130 is deposited. In the present example, it is made of AlGaN. Alternative embodiments use AlN, or AlInN, or AlInGaN.

The thickness of the single interlayer is typically between 10 and 50 nm. In the present example it is 30 nm.

Directly on the single interlayer 130, the second group-III-nitride layer 140 is grown. In the present example, it is made of the same material as the first group-III-nitride layer, that is GaN. In other embodiments, it is made of AlGaN. Its thickness is typically between 300 nm and 1.5 µm. In the present example it is 1 µm thick.

The single interlayer 130 has a carbon concentration of $1 \times 10^{19}$ cm$^{-3}$. In contrast, the first group-III-nitride layer and the second group-III-nitride layer have a lower carbon concentration of not more than $1 \times 10^{18}$ cm$^{-3}$. In the present example, their carbon concentration is $1 \times 10^{17}$ cm$^{-3}$. Due to the different composition of the AlGaN of the single interlayer 130 in comparison with the GaN of the first and second group-III-nitride layers 120 and 140, a difference in lattice constants is achieved, which correlates with a difference in band gap. The difference in lattice constants introduces a stress component that at least partially compensates stress created by the growth on the heterosubstrate. The stress-management layer sequence S made of GaN—AlGaN—GaN is thus able to reduce a stress which occurs in the buffer layer structure and any layers grown on top of it. On the other hand, the stress management layer sequence also introduces a band structure profile that tends to allow the formation of parasitic conductive channels, which may even comprise a 2DEG near the interfaces between the GaN and AlGaN materials. By introducing carbon at the given concentration levels the building of a 2DEG at the interfaces of single interlayer 130 and first and second group-III-nitride layers 120 and 140 is suppressed. Due to its higher carbon concentration, especially the single interlayer layer 130 exhibits also a high resistivity which is needed for the subsequent building of high efficient electronic devices based on such a buffer layer structure.

Figure 2:
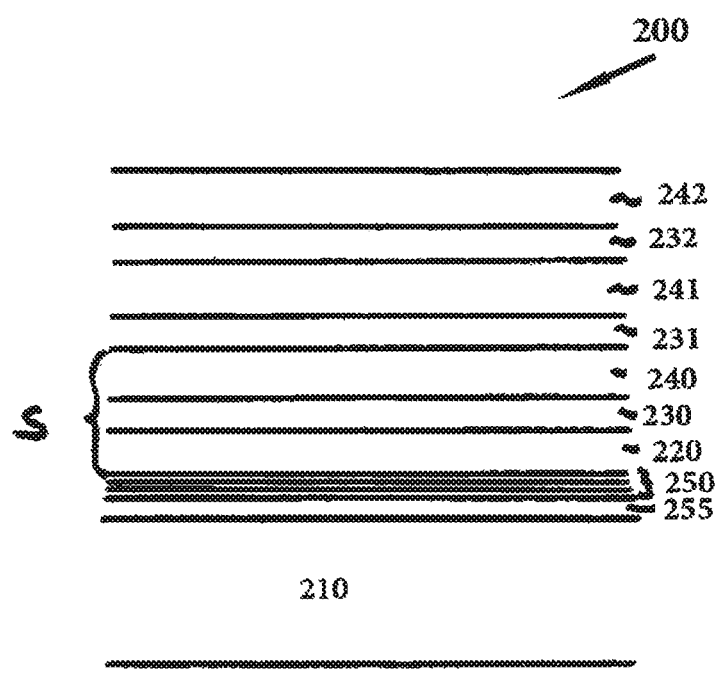
FIG. 2 shows an embodiment of a buffer layer structure according to the invention.

FIG. 2 shows an embodiment of a buffer layer structure 200 according to the invention. Compared with the buffer layer structure 100 of FIG. 1, the buffer layer structure 200 comprises a nucleation layer 255 and a superlattice 250 between a second group-III-nitride layer 220 and the substrate 210. The superlattice 250 and the nucleation layer form an example of an intermediate layer. The nucleation layer 255 is an AlN layer. The superlattice 250 in this embodiment is a high temperature AlGaN/low temperature AlGaN superlattice with a thickness of 100 nm. The nominal composition of the high- and low-temperature AlGaN layers is identical. The nucleation layer 255 and the superlattice 250 further improve the stress management of the buffer layer structure 200. The nucleation layer 255 and the superlattice 250 have a carbon concentration of $5 \times 10^{18}$ cm$^{-3}$ in this example, which improves the resistivity of the buffer layer structure. Other favorable embodiments of the superlattice are AlGaN/GaN or AlN/GaN superlattices.

The use of several first group-III-nitride interlayers within the buffer layer structure further improves the stress management, in particular in the case of a silicon substrate, where the lattice mismatch to group-III-nitride materials is particularly high. Therefore, on the stress management layer sequence S comprising the first group-III-nitride layer 220, the single interlayer 230 and the second group-III-nitride layer 240, two repetitions of the stress management layer sequence are deposited. A first repetition contains a further single interlayer 231 and a further group-III-nitride layer 241, the group-III-nitride layer 240 is the first group-III-nitride layer in regard of the second single interlayer 231 and at the same time the second group-III-nitride layer in regard of the first single interlayer 230. A second repetition contains a further single interlayer 232 and a further group-III-nitride layer 242. Here the group-III-nitride layer 241 is the first group-III-nitride layer in regard of the third single interlayer 232 and the second group-III-nitride layer in regard of the second single interlayer 231. The first single interlayer 230 and its repetitions 231, 232 are thus all arranged between and adjacent to group-III-nitride layers, which in comparison have a lower band gap.

In an embodiment also properties other than the thickness of the single interlayers can vary, preferably the Al content can decrease in the direction pointing away from the substrate. In another embodiment (not shown) more than one layer with lower band gap may follow the first group-III-nitride layer (or any of its repetitions).

The single interlayer 231 in this embodiment has identical properties (composition, thickness, growth temperature) as single interlayer layer 230. The group-III-nitride layer 241 corresponds to the third group-III-nitride layer 240. However, in the present example, it is somewhat thicker than the third group-III-nitride layer 240, namely 2 µm thick. It is thus possible, but not a requirement to have the layers of the second stress management layer sequence S1 identical to corresponding layers of the original stress management layer sequence S. It is also possible to vary layer thicknesses between different repetitions of the second stress management layer sequence S2. However, the thickness of the first group-III-nitride layer 230 and its corresponding repetitions in the layers 231 and 232 is preferably the same.

Figure 3:
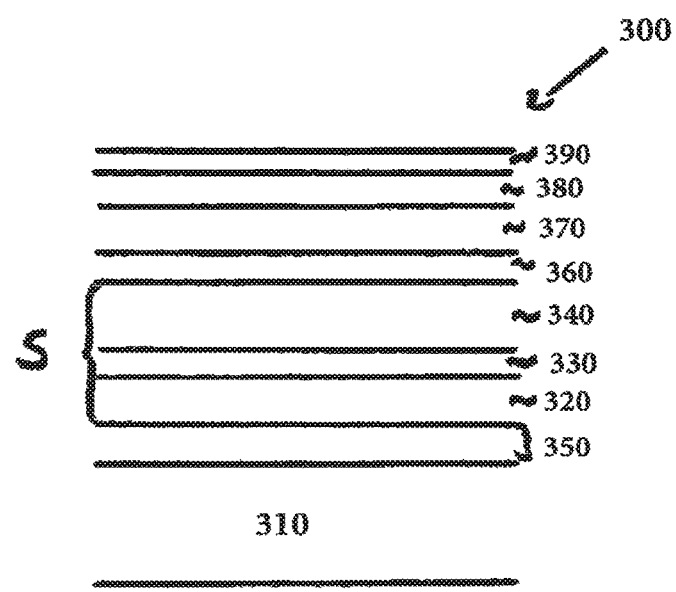
FIG. 3 shows an embodiment of a group-III-nitride device according to the invention.

FIG. 3 shows a transistor 300 as an application case of the group-III-nitride buffer layer structure according to the invention. In this embodiment, an AlGaN buffer layer 350 having a Ga fraction increasing with increasing distance from a silicon substrate 310 is grown on the silicon substrate 310.

On the AlGaN buffer layer 350, a stress management layer sequence S is formed of three group-III-nitride layers 320 to 340, of which a single interlayer 330 is sandwiched between a first group-III-nitride layer 320 and a second group-III-nitride layer 340. For the detailed characteristics of these layers, we refer to the above description of the layers 120 to 140 of the embodiment of FIG. 1.

The stress management layer sequence S is followed by a back barrier layer 360. The back barrier layer 360 is made of AlGaN and has a graded carbon concentration starting with a carbon concentration of $1 \times 10^{18}$ cm$^{-3}$ at an interface between back barrier layer 360 and third group-III-nitride layer 340, and ending with a carbon concentration of less than $4 \times 10^{16}$ cm$^{-3}$ at an interface between back barrier layer 360 and a following active layer 370.

The active layer 370, which forms a channel layer that contains a 2DEG charge carrier channel active in operation of the transistor, is made of GaN and has a carbon concentration of $4 \times 10^{16}$ cm$^{-3}$. In the present example, it is 40 nm thick. A transistor based on the described structure shows the following properties: a charge carrier density of around $1 \times 10^{13}$ cm$^{-2}$, a high electron mobility of 1000-2500 cm$^2$/(V·s) and a low sheet resistance clearly below 400 Ω/sq.

On the active layer 370, a barrier layer 380 is grown. The barrier layer is an AlGaN (AlGaInN) layer in the present example. In other embodiments, other compositions may be used that are suitable to form a potential barrier for charge carriers that are in the channel layer. The barrier layer has a thickness of 25 nm in the present example. A cap layer 390 is grown on the barrier layer 380 and forms a uppermost layer of the transistor structure (disregarding contacts). In the present case for d mode HEMT devices, the cap layer 390 is a p-doped GaN layer with a thickness of 4 nm. In the cap layer 390 carbon is used a dopant at a concentration level of $10^{17}$ cm$^{-3}$ in this example.

The buffer layer structure of this embodiment leads to a favorable stress management of the whole structure and at the same time achieves a high resistance below the active layers. The graded back barrier layer 360 additionally prevents carriers from entering the underlying layers of the buffer layer structure and the substrate, which improves the electrical performance of the device. The active layer 370 (GaN or InGaN) grown on the buffer layer structure exhibits a high crystal quality and a low resistance due to its low carbon concentration. With the GaN cap layer 390 a good electrical contact to contact structures and external devices is achieved. To reduce the series resistance of the HEMT device additional recess etching of GaN-cap and part of the AlGaN-layer in lateral sections for ohmic contact formation is favorable.

Figure 4A:
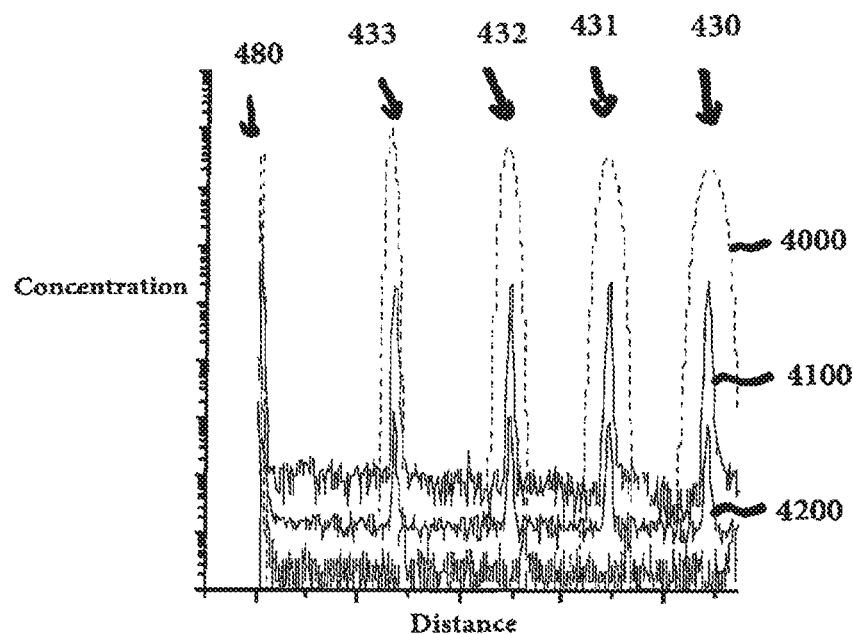
FIG. 4a shows a concentration diagram for parts of a transistor based on a buffer layer structure according to the invention.
Figure 4B:
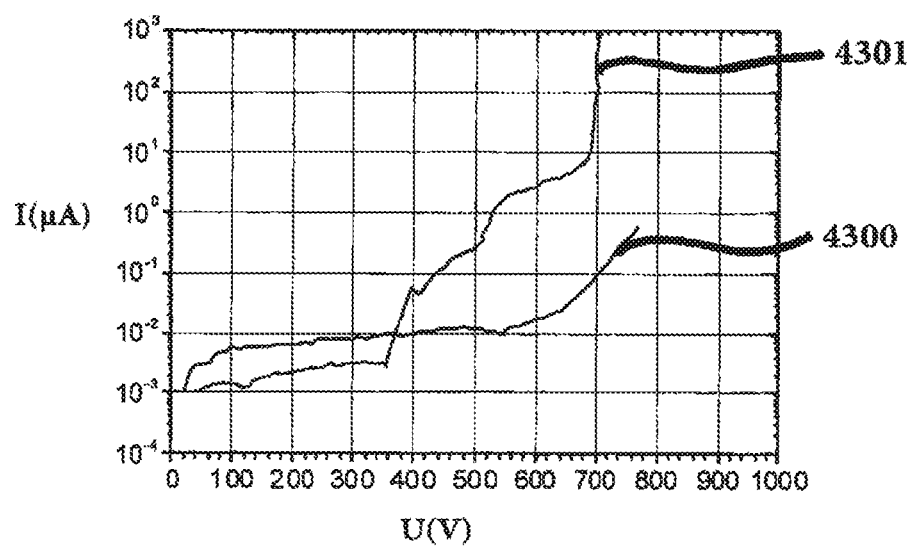

FIG. 4a shows a concentration diagram for parts of a transistor based on a buffer layer structure according to the invention as obtained from a secondary ion mass spectroscope (SIMS) measurement. FIG. 4b shows a current-voltage characteristic of the transistor of FIG. 4a.

FIG. 4a shows traces of an aluminum concentration 4000, a carbon concentration 4100 and an oxygen concentration 4200 on a logarithmic scale as a function of depth for a portion of the transistor including a buffer layer structure. Maxima 430, 431, 432 and 433 of the aluminium concentration 4000 are detected at the positions of the single interlayers. This is indicative of an Al contribution to AlGaN stoichiometry of the single interlayers.

A maximum 480 in the aluminum trace 4000 represents an AlGaN barrier layer. As can be seen from the diagram of FIG. 4a, also the carbon concentration 4100 and the oxygen concentration exhibit respective maxima at the positions of the first group-III-nitride layers, i.e., at the Al peaks. The carbon concentration in the single interlayers is $2 \times 10^{20}$ cm$^{-3}$, while the carbon concentration in the GaN layers between the single interlayers is slightly below $1 \times 10^{17}$ cm$^{-3}$. Thus the carbon concentration in the single interlayers is 3 orders of magnitude higher than in the GaN layers there between. The formation of a 2DEG in the buffer layer structure is thereby suppressed. As shown in the diagram of FIG. 4b the transistor based on the described buffer layer structure with high carbon content (4300) exhibit high breakdown voltage and low leakage current. The characteristic curve of a transistor according to the invention is herein compared with the characteristic curve (4301) of a transistor based on a buffer layer structure which differs from the claimed structure in the fact that a low p-type concentration of less than $1 \times 10^{18}$ cm$^{-3}$ is used in the interlayer structures.

Figure 5:
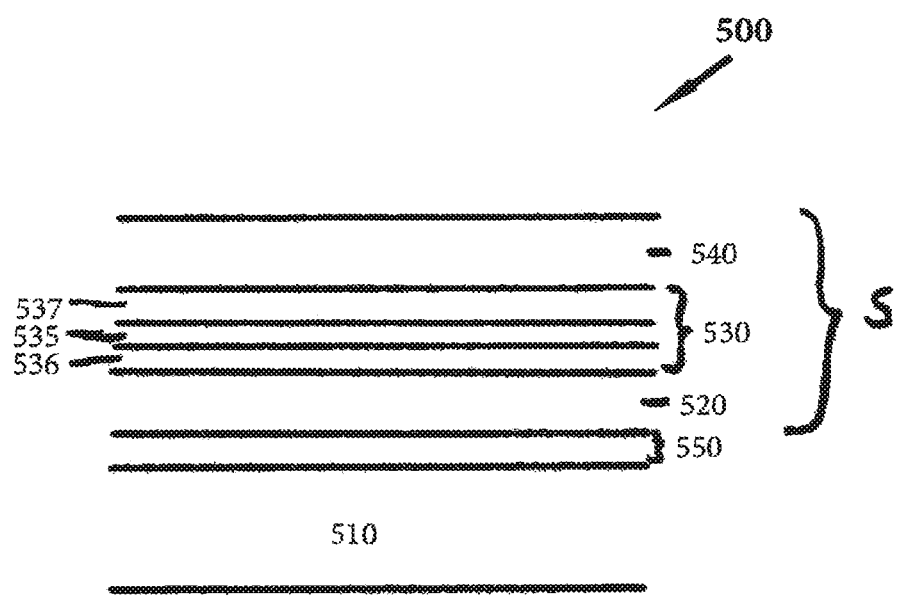
FIG. 5 shows another embodiment of a buffer layer structure according to the first aspect of the invention.

FIG. 5 shows another embodiment of a buffer layer structure 500 according to the first aspect of the invention. Compared with the buffer layer structures of the FIG. 1 to 4, the buffer layer structure 500 comprises a buffer layer 550, a substrate 510, and an interlayer structure 530 comprising three different layers instead of a single layer. After the growing of the first group-III-nitride layer 520, in this example made of unintentionally doped GaN, a second group-III-nitride interlayer 536 is grown also formed of GaN. The second group-III-nitride interlayer is followed by a first group-III-nitride interlayer 535 and a third group-III-nitride interlayer 537, whereby the third group-III-nitride interlayer 536 also formed of GaN and is followed by a second group-III-nitride layer 540. The second and third group-III-nitride interlayers 535 and 537 have thicknesses of 50 nm in this embodiment. Thicknesses between 20 and 200 nm are favorable for these layers. The first group-III-nitride interlayer 535 comprises a group-III-nitride interlayer material having a larger band gap than the materials of the first and second group-III-nitride layers 520, 540, in this case AlGaN, and has a thickness of 30 nm. In the following variations of the buffer layer structure including different modifications of the Al content of the first group-III-nitride interlayer 535 and of the p-dopant concentration will be presented and their effects on the prevention of the 2DEG building.

Variation 1

Variation 1 of the layer structure shown in FIG. 5 includes the use of a first group-III-nitride interlayer 535 with constant aluminum content. The aluminum content profile for the structure is shown in FIG. 6a in principle. As stated before in this embodiment the second and third group-III-nitride interlayers 536 and 537 are made of GaN as well as the first and second group-III-nitride layers 520 and 540. The first group-III-nitride interlayer 535 includes AlGaN. FIG. 6b shows the hole concentration profile for the structure, the hole concentration is $5 \times 10^{18}$ cm$^{-3}$ within the whole interlayer structure, thus in all three group-III-nitride interlayers 535, 536 and 537. The first and second group-III-nitride layers 520 and 540 are unintentionally doped. The hole concentration in the interlayer structure is achieved by intentionally doping the interlayers with magnesium or carbon. The shown hole concentration profile for this layer structure leads to the energy profiles of the layer structure shown in FIG. 6c, whereby 601 represents the conduction band energy profile and 602 represents the valence band profile. As can be seen in FIG. 6c the building of a 2DEG at the interfaces between AlGaN and GaN, thus between the first group-III-nitride interlayer 535 and the second and third group-III-nitride interlayers 536 and 537 is effectively suppressed.

Variation 2

Variation 2 of the layer structure shown in FIG. 5 includes the use of a first group-III-nitride interlayer 535 with a gradient in the aluminum content. The aluminum content profile for the structure is shown in FIG. 7a in principle. In this embodiment the second and third group-III-nitride interlayers 536 and 537 are made of GaN as well as the first and second group-III-nitride layers 520 and 540. The aluminum content of the first group-III-nitride interlayer 535 increases from 10% at the interface to the second group-III-nitride interlayer 536 to 70% at the interface to third group-III-nitride interlayer 537. The increase can be either continuous as shown in the diagram or stepwise.

FIG. 7b shows the hole concentration profile for the structure, the hole concentration for this embodiment is $1 \times 10^{18}$ cm$^{-3}$ within the whole interlayer structure, thus in all three group-III-nitride interlayers 535, 536 and 537. The first and second group-III-nitride layers 520 and 540 are unintentionally doped.

As can be seen in FIG. 7c the building of a 2DEG at the interfaces between AlGaN and GaN, thus between the first group-III-nitride interlayer 535 and the second and third group-III-nitride interlayers 536 and 537 is effectively suppressed with the relatively smaller hole concentration respectively p-dopant-concentration if a graded AlGaN layer is used as the first group-III-nitride interlayer.

Variation 3

Variation 3 of the layer structure shown in FIG. 5 shows compared to Variation 2 another advantageous hole concentration profile with which the building of parasitic 2DEG can be effectively suppressed. The aluminum content profile for the structure, shown in FIG. 8a is in principle the same as the one shown in FIG. 7a.

FIG. 8b shows the hole concentration profile for the structure, the hole concentration for this embodiment is $5 \times 10^{18}$ cm$^{-3}$ only in the second and third group-III-nitride interlayers 536 and 537, the first group-III-nitride interlayer 535 is unintentionally doped as well as the first and second group-III-nitride layers 520 and 540.

As can be seen in FIG. 8c where the energy bands of the structure at 300V are shown, the building of a 2DEG at the interfaces between AlGaN and GaN, thus between the first group-III-nitride interlayer 535 and the second and third group-III-nitride interlayers 536 and 537 can also effectively be suppressed without intentional doping of the first group-III-nitride interlayer 535 if the doping level of the second and third group-III-nitride interlayers 536 and 537 is sufficiently high, even in operation.

As described in FIG. 2 relating to single interlayers also with the described interlayer structures comprising three group-III-nitride interlayers repetitions of the stress management layer sequence are advantageous. For example a first stress management layer sequence comprising a single interlayer made of AlN followed by a three stress management layer sequences each comprising a three-layer interlayer structure of GaN—AlGaN—GaN can be advantageous.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An epitaxial group-III-nitride buffer-layer structure on a silicon, the buffer-layer structure comprising:
   a first group-III-nitride layer and a second group-III-nitride layer, the first group-III-nitride layer and the second group-III-nitride layer formed of GaN; and
   at least one stress management layer sequence including an interlayer structure arranged between and adjacent to the first group-III-nitride layer and the second group-III-nitride layer,
   wherein the interlayer structure comprises a group-III-nitride interlayer material having a larger band gap than materials of the first group-III-nitride layer and the second group-III-nitride layer,
   wherein a p-type-dopant-concentration profile drops, starting from at least $1 \times 10^{18}$ cm$^{-3}$, by at least a factor of two in transition from the interlayer structure to the first group-III-nitride layer and the second group-III-nitride layer,
   wherein a thickness of the first group-III-nitride layer is between 300 nm and 2000 nm,
   wherein a thickness of the second group-III-nitride layer is between 300 nm and 1500 nm,
   wherein the interlayer structure comprises three different layers, a first, a second and a third group-III-nitride interlayers, wherein a thicknesses of each of these is between 20 nm and 200 um,
   wherein the second group-III-nitride interlayer and the third group-III-nitride interlayer are formed of GaN, and
   wherein the first group-III-nitride interlayer is formed of AlGaN, and
   wherein the first group-III-nitride interlayer comprises a constant aluminum content or comprises a gradient in an aluminum content increasing from the second group-III-nitride interlayer to the third group-III-nitride interlayer.

2. The buffer-layer structure according to claim 1, wherein the interlayer structure comprises a single layer having a thickness between 10 nm and 50 nm.

3. The buffer-layer structure according to claim 1, wherein the stress management layer sequence is made of GaN—AlGaN—GaN.

4. The buffer-layer structure according to claim 1, wherein the p-type-dopant concentration profile drops in transition from the interlayer structure to the first and second group-III-nitride layers by at least one order of magnitude or by at least two orders of magnitude or wherein a carbon concentration in the interlayer structure is three orders of magnitude higher than in the GaN layers.

5. The buffer-layer structure according to claim 1, wherein the second croup-III-nitride interlayer and the third group-III-nitride interlayer are made of GaN as well as the first group-III-nitride layer and the second group-III-nitride layer and wherein the aluminum content of the first group-III-nitride interlayer increases from 10% at an interface to the second group-III-nitride interlayer to 70% at an interface to the third group-III-nitride interlayer.

6. The buffer-layer structure according to claim 5, wherein a hole concentration caused by p-doping is constant within the whole interlayer structure, thus in all three group-III-nitride interlayers.

7. The buffer-layer structure according to claim 5, wherein a hole concentration caused by p-doping is $1 \times 10^{18}$ cm$^{-3}$ within the whole interlayer structure, thus in all three group-III-nitride interlayers.

8. The buffer-layer structure according to claim 5, wherein a hole concentration caused by p-doping for the second group-III-nitride interlayer and the third group-III-nitride interlayer is higher than a hole concentration of the first group-III-nitride interlayer.

9. The buffer-layer structure according to claim 8, wherein the first group-III-nitride interlayer is unintentionally doped.

10. The buffer-layer structure according to claim 8, wherein the hole concentration caused by p-doping is $5 \times 10^{18}$ cm$^{-3}$ in the second group-III-nitride interlayer and the third group-III-nitride interlayer.

11. The buffer-layer structure according to claim 10, further comprising a p-type dopant, wherein the p-type dopant is carbon or magnesium, or a combination of carbon and magnesium.

12. The buffer-layer structure according to claim 1, further comprising at least two stress management layer sequences, wherein a second stress management layer sequence is arranged a larger distance from a substrate than a first stress management layer sequence having a second interlayer structure.

13. A group-III-nitride device, a FET, a normally-on or a normally-off HEMT or MIS-HEMT, a Schottky diode, a PIN diode, or a LED comprising an epitaxial group-III-nitride buffer layer structure on a heterosubstrate according to claim 1.

* * * * *